(12) United States Patent
Gibbs et al.

(10) Patent No.: US 9,145,059 B2
(45) Date of Patent: Sep. 29, 2015

(54) METHOD AND SYSTEM FOR ESTIMATING CELL RESISTANCES WITHIN A VEHICLE BATTERY

(75) Inventors: James C. Gibbs, Brighton, MI (US); Joseph Bisbing, White Lake, MI (US); Kurt M. Johnson, Brighton, MI (US); Damon R. Frisch, Troy, MI (US); Brian J. Koch, Berkley, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 356 days.

(21) Appl. No.: 13/228,608

(22) Filed: Sep. 9, 2011

(65) Prior Publication Data

US 2013/0063094 A1 Mar. 14, 2013

(51) Int. Cl.
*B60L 7/14* (2006.01)
*G01R 31/36* (2006.01)
(Continued)

(52) U.S. Cl.
CPC . *B60L 7/14* (2013.01); *B60L 3/003* (2013.01); *B60L 3/0046* (2013.01); *B60L 7/12* (2013.01); *B60L 11/126* (2013.01); *B60L 11/1816* (2013.01); *B60L 11/1857* (2013.01); *B60L 11/1859* (2013.01); *B60L 11/1861* (2013.01); *B60L 11/1866* (2013.01); *B60L 11/1877* (2013.01); *B60L 11/1879* (2013.01); *G01R 31/3624* (2013.01); *H01M 10/441* (2013.01); *H01M 10/482* (2013.01); *H01M 10/486* (2013.01); *B60L 2210/14* (2013.01); *B60L 2210/30* (2013.01); *B60L 2210/40* (2013.01); *B60L 2240/36* (2013.01); *B60L 2240/545* (2013.01); *B60L 2240/547* (2013.01);

(Continued)

(58) Field of Classification Search
CPC .................................................. H01M 10/486
USPC ......................................................... 320/134
See application file for complete search history.

(56) References Cited

U.S. PATENT DOCUMENTS 6,486,637 B1 * 11/2002 Nakanishi et al. ............ 320/150
7,548,821 B2 * 6/2009 Tae et al. ......................... 702/63
(Continued)

FOREIGN PATENT DOCUMENTS

CN 102064571 A 5/2011

OTHER PUBLICATIONS

Chinese Office action dated Apr. 3, 2015.

*Primary Examiner* — Samuel Berhanu
*Assistant Examiner* — Jerry D Robbins
(74) *Attorney, Agent, or Firm* — Lionel D. Anderson; Reising Ethington P.C.

(57) ABSTRACT

A method and system for use with a vehicle battery pack having a number of individual battery cells, where the method estimates, extrapolates or otherwise determines individual cell resistances. According to an exemplary embodiment, the method and system use a voltage and temperature reading for each of the individual battery cells, as well as a voltage and current reading for the overall battery pack to determine one or more cell resistance values, such as a minimum and maximum cell resistance for the battery pack. This approach relies upon temperature deviations in the battery pack to make assumptions or estimates regarding individual battery cell resistances. By having individual cell resistance values—instead of using an overall pack resistance value and building in a buffer to account for cell variations—better and more accurate cell-level data can be obtained that, in turn, can improve charging, discharging, cell balancing and/or other battery-related processes.

15 Claims, 3 Drawing Sheets (51) Int. Cl.
*H01M 10/44* (2006.01)
*H01M 10/48* (2006.01)
*B60L 3/00* (2006.01)
*B60L 7/12* (2006.01)
*B60L 11/12* (2006.01)
*B60L 11/18* (2006.01)

(52) U.S. Cl.
CPC ....... *B60L2240/549* (2013.01); *G01R 31/3662* (2013.01); *Y02T 10/6217* (2013.01); *Y02T 10/7005* (2013.01); *Y02T 10/7044* (2013.01); *Y02T 10/7061* (2013.01); *Y02T 10/7077* (2013.01); *Y02T 10/7225* (2013.01); *Y02T 10/7241* (2013.01); *Y02T 90/127* (2013.01); *Y02T 90/14* (2013.01)

(56) References Cited

U.S. PATENT DOCUMENTS

| | | | |
|---|---|---|---|
| 7,893,694 B2* | 2/2011 | Plett | 324/432 |
| 2008/0054845 A1* | 3/2008 | Wang | 320/111 |
| 2009/0189613 A1* | 7/2009 | Plett | 324/426 |
| 2010/0047684 A1* | 2/2010 | Okumura et al. | 429/156 |
| 2010/0188050 A1* | 7/2010 | Asakura et al. | 320/136 |
| 2011/0012562 A1* | 1/2011 | Paryani | 320/152 |
| 2011/0109273 A1 | 5/2011 | Tamezane | |
| 2011/0199053 A1* | 8/2011 | Minamiura | 320/136 |

\* cited by examiner

METHOD AND SYSTEM FOR ESTIMATING CELL RESISTANCES WITHIN A VEHICLE BATTERY

TECHNICAL FIELD

The present invention generally relates to vehicle batteries, and more particularly, to methods and systems for estimating or otherwise determining certain vehicle battery parameters, such as individual battery cell resistances.

BACKGROUND

In vehicle batteries having a large number of individual battery cells, it can sometimes be difficult to accurately and efficiently collect data on a cell-level basis. For example, computational limitations and data synchronization issues may prevent the vehicle from being able to directly calculate the individual cell resistance for each battery cell on a rapid basis that is both accurate and economically feasible. One potential solution to these challenges is to take frequent measurements of battery parameters on a pack-level basis and then to extrapolate the measurements to a cell-by-level basis. However, when estimating cell data based on pack data, a conservative estimate is oftentimes required that involves a buffer to take into account discrepancies between individual battery cells. Conservative estimates can reduce the overall efficiency of the system, as the capabilities of each of the battery cells may not be fully utilized.

SUMMARY

According to one embodiment, there is provided a method for use with a vehicle battery pack having a plurality of battery cells. The method may comprise the steps of: (a) measuring a plurality of battery cell temperatures ($T_{cell}$); (b) measuring a battery pack voltage ($V_{pack}$) and a battery pack current ($I_{pack}$); (c) using the battery pack voltage ($V_{pack}$) and the battery pack current ($I_{pack}$) to determine a battery pack resistance ($\Omega_{pack}$); and (d) using the plurality of battery cell temperatures ($T_{cell}$) and the battery pack resistance ($\Omega_{pack}$) to estimate one or more battery cell resistance(s) ($\Omega_{cell}$).

According to another embodiment, there is provided a method for use with a vehicle battery pack having a plurality of battery cells. The method may comprise the steps of: (a) gathering cell-level readings, wherein the cell-level readings include information pertaining to a temperature spread across the vehicle battery pack; (b) gathering pack-level readings; (c) using the cell-level readings and the pack-level readings to estimate one or more battery cell resistance(s) ($\Omega_{cell}$); and (d) using the battery cell resistance(s) ($\Omega_{cell}$) when controlling a battery charging, discharging or cell balancing process.

DRAWINGS

Preferred exemplary embodiments will hereinafter be described in conjunction with the appended drawings, wherein like designations denote like elements, and wherein.

DESCRIPTION

The method and system described herein may be used with a vehicle battery pack having a number of individual battery cells and, more particularly, they may be used to estimate, extrapolate or otherwise determine individual cell resistances. As mentioned above, sometimes it is not feasible to directly measure or even calculate the resistance and/or other parameters on a cell-by-cell basis; such a process may be too computationally intensive, particularly when it needs to be repeated at a high rate or frequency. The present method and system may use a combination of pack-level and cell-level data to estimate a cell resistance for each of the individual battery cells. According to an exemplary embodiment, the method and system use a voltage and temperature reading for each of the individual battery cells, as well as a voltage and current reading for the overall battery pack to determine one or more cell resistance values, such as the minimum and maximum cell resistance across the battery pack. This approach may rely upon temperature deviations in the battery pack to make assumptions or estimates regarding individual battery cell resistances (temperature can affect cell resistance). By having individual cell resistance values—instead of using an overall pack resistance value and building in a buffer to account for cell variations—better and more accurate cell-level data can be obtained that, in turn, can improve charging, discharging, cell balancing and/or other battery-related processes.

Figure 1:
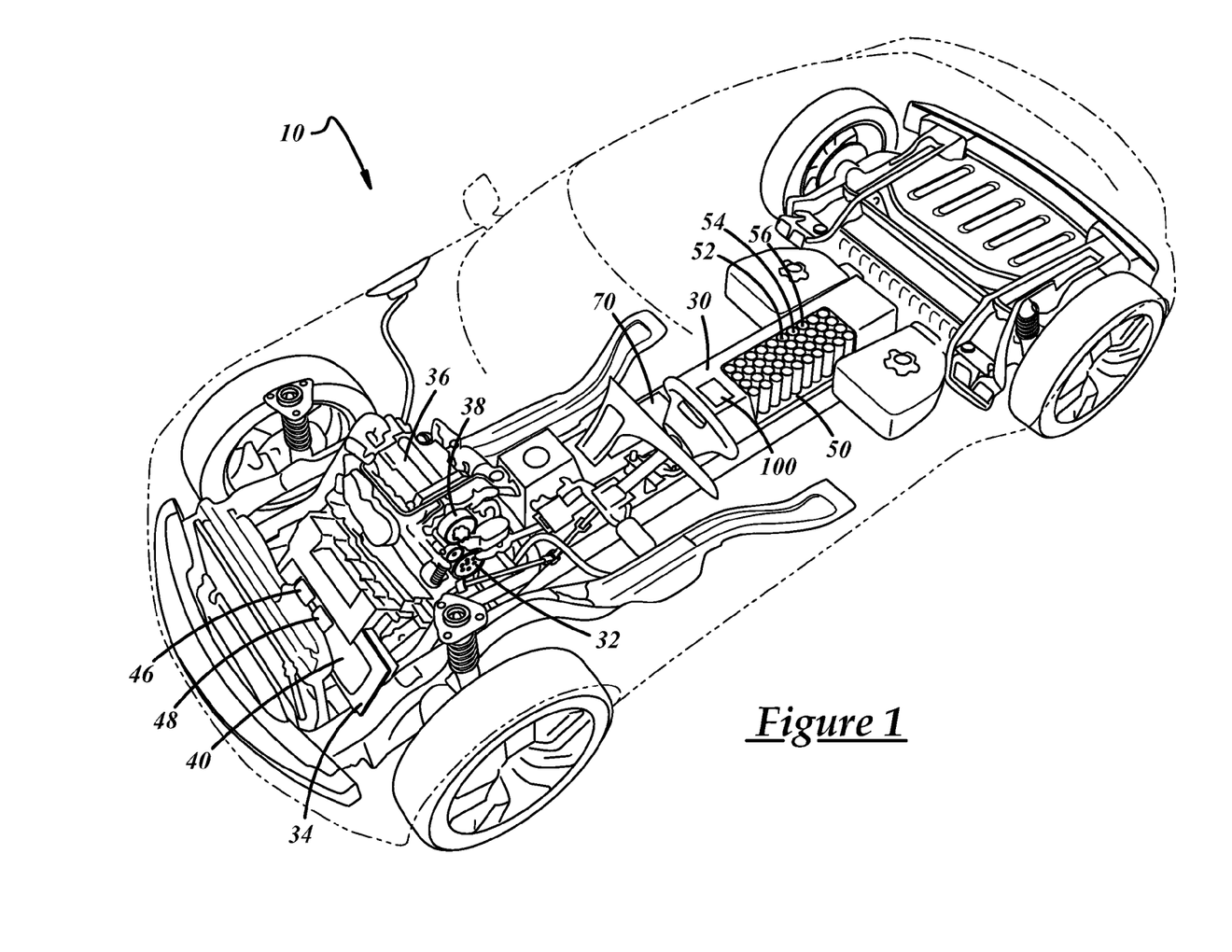
FIG. 1 is a schematic diagram of an exemplary plug-in hybrid electric vehicle (PHEV)

With reference to FIG. 1, there are shown some of the components of an exemplary plug-in hybrid electric vehicle (PHEV) 10 that may be used with the method and system described herein. Although the following description is provided in the context of this particular PHEV, it should be appreciated that this vehicle is merely exemplary and that other vehicles may certainly be used instead. For example, the method and system described below can be used with any type of vehicle having a high-voltage vehicle battery pack, including a hybrid electric vehicle (HEV), a plug-in hybrid electric vehicle (PHEV), an extended-range electric vehicle (EREV), or a battery electrical vehicle (BEV), to cite a few possibilities. According to an exemplary embodiment, vehicle 10 generally includes a vehicle battery 30, an electric motor 32, an inverter/converter 34, an engine 36, a generator 38, and a control module 40.

Figure 2:
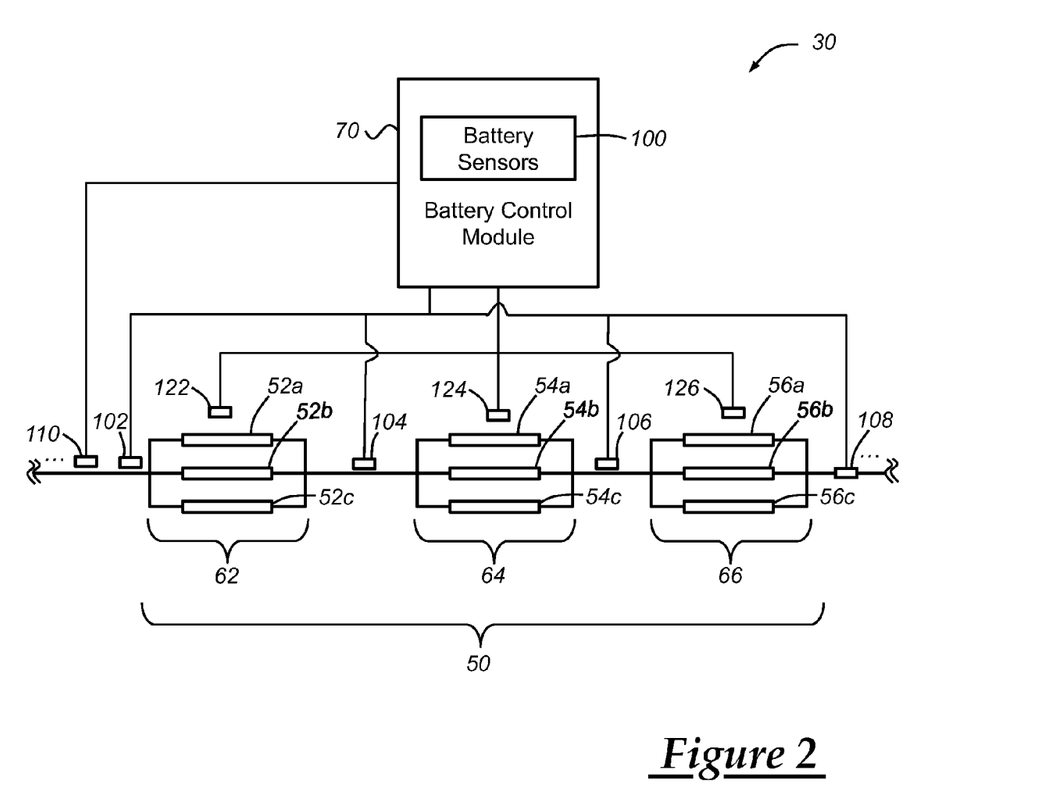
FIG. 2 is a schematic block diagram of a portion of an exemplary vehicle battery pack that has a number of individual battery cells and may be used in a number of different vehicles, such as the one illustrated in FIG. 1.

FIGS. 1 and 2 illustrate portions of an exemplary vehicle battery 30 that may store electrical energy for vehicle propulsion, as well as to meet the other electrical needs of the vehicle. According to an exemplary embodiment, battery 30 includes a high-voltage battery pack 50 (e.g., 40V-600V) having a number of individual battery cells 52-56, a number of cell blocks 62-66, and a battery control module 70. Battery pack 50 includes a collection of individual battery cells 52-56 that may be connected in series, parallel, or a combination of both in order to deliver a desired voltage, amperage, capacity, power density, and/or other performance characteristics. In the example shown in FIG. 2, three battery cells 52a, 52b and 52c are wired in parallel to form a cell block 62; similarly, battery cells 54a, 54b and 54c form cell block 64, and battery cells 56a, 56b and 56c form cell block 66. Cell blocks 62-66 are, in turn, wired in series to form parts of battery pack 50. FIG. 2 illustrates only one potential embodiment of battery pack 50, as other arrangements, connections and/or embodiments are also possible. For instance, more or less than three battery cells may form a cell block, or the cell blocks can be wired together with a combination of parallel and series connections, instead of just being wired together in series.

Battery pack 50 may utilize any suitable battery chemistry, including those that are based on the following technologies: lithium ion, nickel metal hydride (NiMH), nickel cadmium (NiCd), sodium nickel chloride (NaNiCl), or some other battery technology. According to one example, battery pack 50 includes a number of lithium-ion battery cells. Battery pack 50 should be designed to withstand repeated charge and discharge cycles and may be used in conjunction with other energy storage devices, such as capacitors, super capacitors, inductors, etc. Those skilled in the art will appreciate that the vehicle battery may be provided according to any number of different embodiments, may be connected in any number of different configurations, and may include any number of different sub-components, like sensors, control units and/or any other suitable components known in the art.

Battery control module 70 may include any variety of electronic processing devices, memory devices, input/output (I/O) devices, and other known components, and may perform various control and/or communication related functions. For example, battery control module 70 may receive sensor signals from various battery sensors 100 and evaluate, analyze and/or process the sensor signals in an effort to control one or more aspects of battery 30. In one example, battery control module 70 receives and packages the sensor signals from battery sensors 100 into a sensor message, and then sends the sensor message to control module 40 or some other device over a suitable connection, such as a CAN bus, a system management bus (SMBus), a proprietary communication link, etc. It is possible for battery control module 70 to gather battery sensor readings and store them in local memory along with pertinent battery characteristics and background information pertaining to the battery's cell chemistry, cell capacity, upper and lower battery voltage limits, battery current limits, battery temperature limits, temperature profiles, battery impedance, number or history of charge/discharge events, etc. It should be appreciated that battery control module 70 may be a stand-alone electronic module, it may be incorporated or included within another electronic module in the vehicle (e.g., control module 40), it may be part of a larger network or system, it may be located within the vehicle battery, or it may be external to the battery, to name a few possibilities. Battery control module 70 is not limited to the schematic illustration shown in FIG. 2 and described above. In one embodiment, battery control module 70 includes one or more battery sensors 100.

Battery sensors 100 may include any variety of different sensing components or elements, and may monitor a variety of battery conditions such as voltage, current, state of charge (SOC), state of health (SOH), temperature, etc. Battery sensors 100 may include sensors that are integrated within vehicle battery 30 (e.g., an intelligent or smart battery), are externally located outside of the battery, or are provided according to some other known arrangement. Battery sensors 100 may monitor, sense or otherwise determine battery conditions on a cell-by-cell basis, as an average of a collection or block of cells or region of the battery pack, as an average of the entire battery pack, or according to some other method known in the art. In an exemplary embodiment, battery sensors 100 include voltage sensors 102-108 for sensing individual battery cell or cell block voltage, a current sensor 110 for sensing a current flow through the battery pack, a voltage sensor (not shown) for sensing an overall pack voltage, and any number of other sensors like temperature sensors 122-126 for sensing individual cell or block temperature, etc. Sensors 102-126 may be connected to battery control module 70, control module 40 and/or to any other suitable device.

Electric motor 32 may use electrical energy stored in vehicle battery 30 to drive one or more vehicle wheels, which in turn propels the vehicle. While FIG. 1 schematically depicts electric motor 32 as a single discrete device, the electric motor may be combined with a generator (a so-called "mogen") or it may include multiple electric motors (e.g., separate motors for the front and rear wheels, separate motors for each wheel, separate motors for different functions, etc.), to cite a few possibilities. Vehicle 10 is not limited to any one particular type of electric motor, as many different motor types, sizes, technologies, etc. may be used. In one example, electric motor 32 includes an AC motor (e.g., a three-phase AC induction motor, a multi-phase AC induction motor, etc.), as well as a generator that can be used during regenerative braking. Electric motor 32 may be provided according to any number of different embodiments (e.g., AC or DC motors, brushed or brushless motors, permanent magnet motors, etc.), it may be connected in any number of different configurations, and it may include any number of different components, like cooling features, sensors, control units and/or any other suitable components known in the art.

Inverter/converter 34 may act as an intermediary between vehicle battery 30 and electric motor 32, as these two devices are often times designed to function according to different operational parameters. For example, during vehicle propulsion inverter/converter 34 may step-up the voltage from battery 30 and convert the current from DC to AC in order to drive electric motor 32, while during regenerative braking the inverter/converter may step-down the voltage generated by a braking event and convert the current from AC to DC so that it can be properly stored by the battery. In a sense, inverter/converter 34 manages how these different operational parameters (i.e., AC versus DC, various voltage levels, etc.) work together. Inverter/converter 34 may include an inverter for DC to AC conversion, a rectifier for AC to DC conversion, a step-up converter or transformer for increasing the voltage, a step-down converter or transformer for decreasing the voltage, other suitable energy management components, or some combination thereof. In the exemplary embodiment shown, inverter and converter units are integrated into a single bi-directional device; however, other embodiments are certainly possible. It should be realized that inverter/converter 34 may be provided according to any number of different embodiments (e.g., with separate inverter and converter units, bi-directional or uni-directional, etc.), may be connected in any number of different configurations, and may include any number of different components, like cooling systems, sensors, control units and/or any other suitable components known in the art.

Engine 36 may drive generator 38 using conventional internal combustion techniques, and may include any suitable type of engine known in the art. Some examples of suitable engines include gasoline, diesel, ethanol, flex-fuel, naturally aspirated, turbo-charged, super-charged, rotary, Otto-cycle, Atkins-cycle and Miller-cycle engines, as well as any other suitable engine type known in the art. According to the specific embodiment shown here, engine 36 is a small fuel-efficient engine (e.g., a small displacement, turbo-charged four-cylinder engine) that uses its mechanical output to turn generator 38. Skilled artisans will appreciate that engine 36 may be provided according to any number of different embodiments, may be connected in any number of different configurations (e.g., engine 36 could be part of a parallel hybrid system where the engine is also mechanically coupled to the vehicle wheels instead of exclusively being used to generate electricity), and may include any number of different components, like sensors, control units and/or any other suitable components known in the art.

Generator 38 is mechanically coupled to engine 36 so that the mechanical output of the engine causes the generator to create electrical energy that may be provided to vehicle battery 30, electric motor 32, or both. It is worth noting that generator 38 may be provided according to any number of different embodiments (e.g., the generator of motor 32 and generator 38 may be combined into a single unit), may be connected in any number of different configurations, and may include any number of different components, like sensors, control units and/or any other suitable components known in the art. Generator 38 is not limited to any specific generator type or embodiment.

Control module 40 may be used to control, govern or otherwise manage certain operations or functions of vehicle 10 and, according to one exemplary embodiment, includes a processing device 46 and a memory device 48. Processing device 46 may include any type of suitable electronic processor (e.g., a microprocessor, a microcontroller, an application specific integrated circuit (ASIC), etc.) that executes instructions for software, firmware, programs, algorithms, scripts, etc. This processor is not limited to any one type of component or device. Memory device 48 may include any type of suitable electronic memory means and may store a variety of data and information. This includes, for example: sensed battery conditions; look-up tables and other data structures; software, firmware, programs, algorithms, scripts, and other electronic instructions; component characteristics and background information, etc. The present method—as well as any other electronic instructions and/or information needed for such tasks—may also be stored or otherwise maintained in memory device 48. Control module 40 may be electronically connected to other vehicle devices and modules via I/O devices and suitable connections, like a communications bus, so that they can interact as required. These are, of course, only some of the possible arrangements, functions and capabilities of control module 40, as others are certainly possible. Depending on the particular embodiment, control module 40 may be a stand-alone electronic module (e.g., a vehicle integration control module (VICM), a traction power inverter module (TPIM), a battery power inverter module (BPIM), etc.), it may be incorporated or included within another electronic module in the vehicle (e.g., a power train control module, an engine control module, a hybrid control module, etc.), or it may be part of a larger network or system (e.g., a battery management system (BMS), a vehicle energy management system, etc.), to name a few possibilities.

Again, the preceding description of exemplary plug-in electric vehicle 10 and the drawing in FIG. 1 are only intended to illustrate one potential vehicle arrangement and to do so in a general way. Any number of other vehicle arrangements and architectures, including those that differ significantly from the one shown in FIG. 1, may be used instead.

Figure 3:
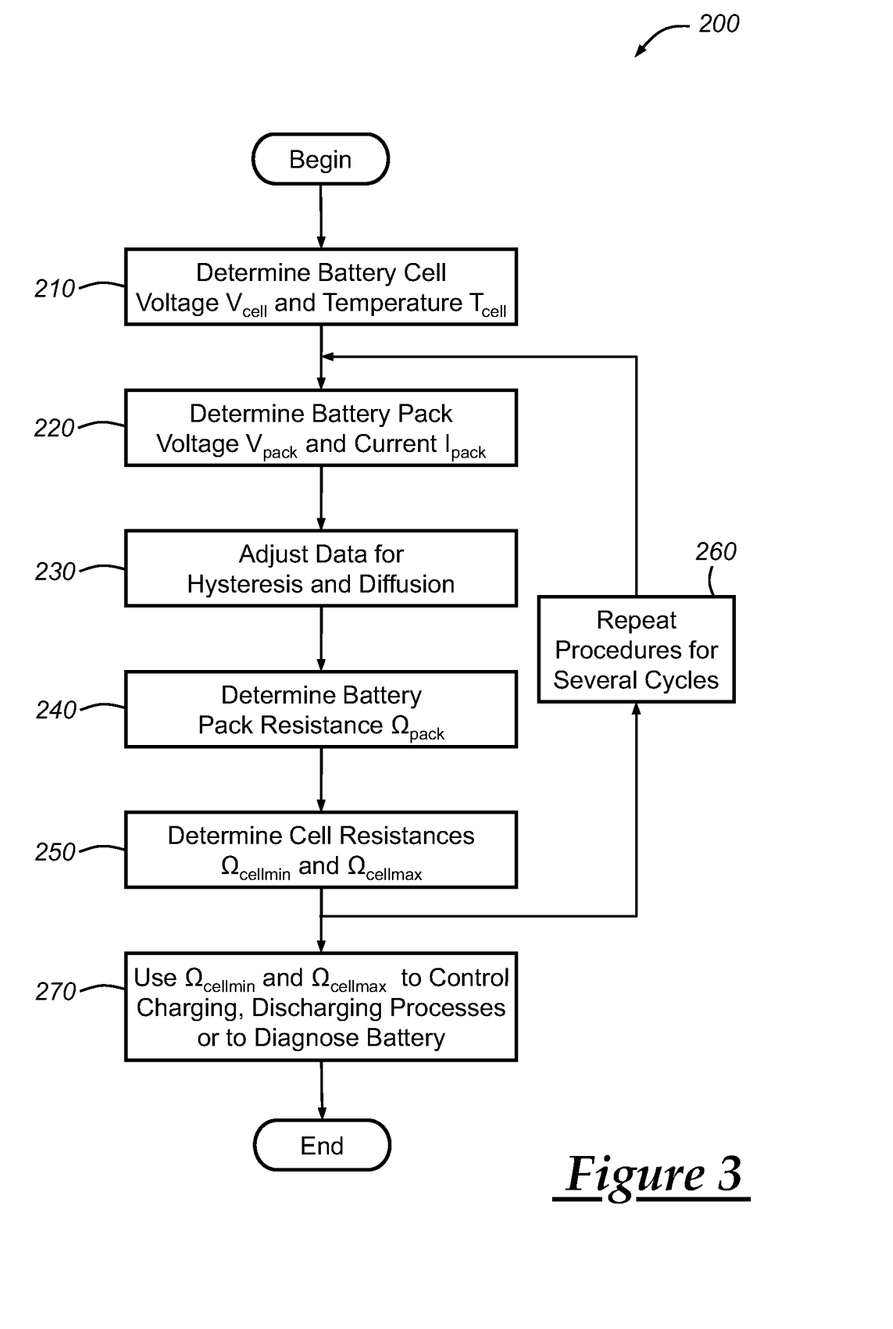
FIG. 3 is a flowchart showing some of the steps of an exemplary method for use with a vehicle battery pack having a number of individual battery cells, like the one illustrated in FIG. 2.

Turning now to FIG. 3, there are shown some of the steps of an exemplary method 200 for use with a vehicle battery having a number of individual battery cells, such as the one illustrated in FIGS. 1 and 2. Method 200 may be used to estimate, extrapolate or otherwise determine cell resistances for the individual battery cells which, in turn, can provide more accurate cell-level data and can improve various battery-related processes, like charging, discharging and cell balancing. As described below, cell temperatures can affect cell resistances in a pretty significant way; this is particularly true at low temperatures where the resistance versus temperature curve is much steeper. The present method uses a combination of cell-level and pack-level data, including individual cell temperatures, to make accurate estimates regarding individual cell resistances that may then be used to improve cell-level control and processes.

Beginning with step 210, the method determines a battery cell voltage $V_{cell}$ and a battery cell temperature $T_{cell}$ for one or more of the cells within the battery pack. Step 210 may acquire these readings in a number of different ways. For example, battery control module 70 may request the sensor readings from the appropriate sensors on a periodic basis (e.g., every 200 msec), the different sensors may be programmed to periodically send the sensor readings to control module 70 without being requested, or the sensors may provide control module 70 with the sensor readings when they sense a certain change in the underlying cell parameters (e.g., a certain temperature rise or drop, a voltage increase or decrease, etc.), to cite a few possibilities. According to one embodiment, voltage sensors 102-104, 104-106 and 106-108 measure battery cell voltages $V_{cell}$ for cells 52a-52c, 54a-54c and 56a-56c, respectively, and temperature sensors 122, 124 and 126 measure battery cell temperatures $T_{cell}$ for cells 52a-52c, 54a-54c and 56a-56c, respectively. The voltage and temperature sensors may measure or otherwise obtain the cell parameters of every cell in battery pack 50 or they may only measure the cell parameters for a sampling or sub-set of the battery cells. Other arrangements are certainly possible, such as where all of the battery cells are connected in series with one another, instead of having the parallel connected cell blocks illustrated in FIG. 2.

It should be appreciated that the frequency with which the sensor readings are sampled or gathered may vary depending on a number of battery characteristics (e.g., battery chemistry, number of cells, whether battery is in charging or discharging mode, etc.). For instance, if a cell temperature or voltage does not vary significantly over time, then the sampling rate may be lower than that of a more rapidly changing parameter. This explains why some of the cell-level data may be sampled or gathered at a first rate (e.g., step 210 gathers sensor readings every 200 ms), and some of the pack-level data is gathered at a second faster rate (e.g., step 220 gathers sensor readings every 25 ms). Even though the description is provided herein in conjunction with cell-level data (e.g., cell temperature, cell voltage, etc.), step 210 may just as easily function on a block-level basis where the parameters are representative of an entire cell block, such as cell blocks 62-66. In some cases, the cell-level and block-level data will be the same. Skilled artisans will recognize that using blocks of parallel-connected cells may be a cost benefit since it will minimize the number of sensors used and the processing and memory resources needed.

Next, step 220 determines battery pack voltage $V_{pack}$ and battery pack current $I_{pack}$ and may do so in a variety of ways. Battery pack voltage may be determined by measuring the overall voltage drop across the entire battery pack 50, while battery pack current may be measured with current sensor 110 or some other suitable sensor element. As with the previous step, step 220 may gather pack-level measurements on a periodic basis, a non-periodic basis, in response to a request from control module 70, without being requested by the control module, or according to any other suitable arrangement known in the art. All of the potential techniques and embodiments disclosed above in conjunction with step 210 are applicable to step 220 as well. According to an exemplary embodiment for step 220, voltage sensors measure the battery pack voltage $V_{pack}$ while current sensor 110 synchronously measures the battery pack current $I_{pack}$. These measurements may be taken at a more rapid rate (e.g., every 25 ms) than that used by step 210. Stated differently, step 220 may gather pack-level measurements or readings at a faster rate than step 210 gathers cell-level measurements or readings. One potential explanation for the different rates is that certain pack-level readings can change more quickly than cell-level readings due to the compounding effect of all of the cells connected together. The pack-level sensor readings for voltage and current may need to be obtained in a synchronous fashion in order to be properly used in the battery pack resistance calculation.

Step 230 makes adjustments or modifications to one or more sensor readings, such as the battery pack voltage ($V_{pack}$) and/or the battery pack current ($I_{pack}$), in order to take into account phenomena like hysteresis and polarization. There are many different techniques for accomplishing step 230, including making adjustments to the data through the use of lookup tables, computational algorithms (e.g., Nernst equation), modeling algorithms, etc. Any suitable technique for removing the effects of hysteresis, polarization or any other non-ideal components that may skew the sensor readings or data may be employed in this step. The degree of hysteresis and/or polarization may be affected by the battery chemistry, the number of cells, the age of the battery, as well as a whole host of other factors. For example, a lithium-ion or a NiMH battery may be influenced by hysteresis when collecting an open circuit voltage (OCV) measurement, which can be a result of thermodynamic entropic effects, mechanical stress, microscopic distortions, etc. Similarly, the battery may be affected by polarization or other macroscopic effects due to very fast and/or very slow charging or discharging rates. These effects may result in battery data comprised of many superimposed effects, each of which may or may not be pertinent to the resistance estimate of interest. It should be recognized that step 230 is optional and is not mandatory, as it may not always be necessary to actively remove these components from the sensor readings.

Next, step 240 uses one or more of the sensor readings to determine the battery pack resistance $\Omega_{pack}$. The battery pack resistance is generally representative of the overall resistance for the entire battery pack 50, and therefore includes the combined or collective resistances of the individual battery cells. One potential embodiment for performing step 240 involves control module 70 calculating or estimating the battery pack resistance $\Omega_{pack}$ by plugging in the values for battery pack voltage $V_{pack}$ and battery pack current $I_{pack}$ into the mathematical expression for Ohm's law (V=I*R). This calculation may be performed using regression techniques involving previous values for $V_{pack}$ and $I_{pack}$ (e.g., values or data going back several minutes). Skilled artisans will recognize that such regression techniques usually need to be highly synchronized and involve rapidly measured sensor readings. Such techniques may be suitable for determining a single overall pack resistance, but oftentimes are too computationally intensive for determining the resistances of all the individual battery cells. Other techniques may be used for performing step 240, as that step is not limited to the regressive battery pack resistance calculation disclosed above.

Step 250 determines one or more individual battery cell resistances, such as a minimum cell resistance $\Omega_{cellmin}$ and/or a maximum cell resistance $\Omega_{cellmax}$. In one exemplary embodiment, step 250 estimates or otherwise determines a battery cell resistance for every individual battery cell within battery pack 50; in another embodiment, step 250 only determines a battery cell resistance for certain cells, like the cells that are believed to have the highest and lowest resistance values. Estimating maximum and minimum cell resistance values only, as opposed to estimating the resistance of all of the cells, can reduce the complexity, processing time and processing resources needed. There are several potential ways for performing step 250, including the use of first estimate and second estimates.

According to the first estimate, the method simply divides the overall battery pack resistance $\Omega_{pack}$ by the number of battery pack units involved (for determining individual battery cell resistances, the pack resistance $\Omega_{pack}$ may be divided by the number of cells in the pack; for determining cell block resistances, the pack resistance $\Omega_{pack}$ can be divided by the number of cell blocks in the pack). The first estimate may provide a baseline-type estimate for cell resistance, which may then be improved by using other battery parameters. For instance, the first estimate for battery cell resistance $\Omega_{cell}$ may be improved or made more accurate by adjusting the average cell resistance for the battery pack up or down based on the individual battery cell voltages $V_{cell}$ taken back in step 210. Other techniques may be used to adjust or improve the accuracy of the first estimate or, in another embodiment, the first estimate may simply be the overall battery pack resistance $\Omega_{pack}$ divided by the number of battery cells. The first estimate can provide a somewhat accurate estimate as to individual battery cell resistance, but it does not take into account the temperature spread across the battery pack; the temperature spread may be addressed by the second estimate.

According to the second estimate, the method determines one or more battery cell resistances $\Omega_{cell}$ by using the temperature spread across the battery pack. The first and second estimates may be used separately or independently or, as in the case of the exemplary embodiment described below, the first and second estimates may be used together in a two-stage or two-phase process that improves the accuracy of the cell resistance estimates. According to one potential embodiment for such a two-stage process, the first estimate is an initial baseline estimate and the second estimate is a subsequent refined estimate that further improves the accuracy of the battery cell resistances $\Omega_{cell}$ by correlating the temperature of the individual cells to their resistance. The second estimate may use one or more lookup tables, multipliers, offset values, and/or other tools based on empirical or other temperature/resistance data to adjust the baseline estimates for battery cell resistance up or down.

Consider the example where the average battery cell resistance $\Omega_{cell}$ for the overall battery pack is 1.0Ω, as determined by the first estimate, the average battery cell temperature $T_{cell}$ across the pack is 30° C., and the method is attempting to determine the cell resistance for a first cell having a temperature of 32° C. and a second cell having a temperature of 29° C. Using a look-up table or other data structure, step 250 may determine that because the first battery cell is 2° C. higher or warmer than the average cell temperature it should be assigned an offset value −0.25 Ω or −25%, which results in an estimated cell resistance $\Omega_{cell}$ of 0.75Ω. Generally speaking, warmer battery cells have lower cell resistance values than colder ones. Conversely, the second battery cell has a temperature that is 1° C. lower or cooler than the average cell temperature and may therefore be assigned an offset value of +0.15 Ω or +15%, which results in an estimated cell resistance $\Omega_{cell}$ of 1.15Ω. The offset value that is used by the second estimate to adjust the cell resistance up or down can be an absolute value (e.g., 0.25 Ω, 0.15Ω, etc.), it can be a percentage, ratio or fraction (e.g., 25%, 15%, etc.), or it can be a positive or negative value, to cite several possibilities. Moreover, the relationship between offset value and temperature differential may not be linear, as the relationship may become exponential as the battery cell temperature deviates further from the average or moves into more extreme temperature ranges. This may be particularly true at the lower or colder end of the temperature spectrum.

As stated above, it is not necessary for step 250 to estimate the cell resistance for every batter cell in battery pack 50, as it may only estimate the cell resistance for certain cells instead. For example, step 250 may estimate the minimum and maximum cell resistances ($\Omega_{cellmin}$ and $\Omega_{cellmax}$) for the battery pack based on the battery cells with the highest and lowest temperatures ($T_{cellhigh}$ and $T_{celllow}$), respectively, and it may do so using any one of the techniques described above. In one embodiment, step 250 selects the hottest and coldest battery cells, uses a look-up table or the like to determine an offset value, and then determines the maximum and minimum cell resistances using the derived offset values. Knowing the minimum and maximum cell resistances within a battery pack can be helpful, especially when controlling the flow of electrical power into or out of the battery pack or when diagnosing the battery pack for problems. To illustrate, many vehicle battery controls are designed at a pack-level, instead of a cell-level, and oftentimes use buffers or dead-bands built into their charging thresholds in order to protect those cells having above average resistances. Without these buffers the higher resistance battery cells could be overcharged and damaged during a charging process, however, this protection comes at the expense of performance. The present method may be able to more efficiently control battery charging and/or discharging processes by pushing the thresholds right up to the limits established by the minimum and maximum cell resistances ($\Omega_{cellmin}$ and $\Omega_{cellmax}$), instead of having to overcompensate with conservative buffers. Additional benefits are also possible in the area of battery diagnosis, as voltage variations from cell to cell can be an indication that a battery pack is failing. However, some cell voltage variation is inherent due to variations in cell resistance caused by the temperature spread across the pack. Accordingly, the present method may provide a more true indication of the health or status of the battery pack and avoid unnecessary battery pack replacement costs.

The present method may be employed on an individual cell basis or on a cell block basis, as discussed above. In the example where a battery pack is arranged with parallel-connected cells in the form of cell blocks, as illustrated in FIG. 2, the cells of one block can be considered to have the same resistance value as each other. Appropriate techniques for determining the combined resistance of cells connected in parallel and/or in series are widely known in the art and may be employed. An offset value or multiplier may be applied to the combined resistance of the cell block in order to determine a more accurate cell block resistance value, if such a value is required. The temperature spread across battery pack 50 can be a good parameter for use in the present method due to its slow changing nature, which allows for approximation of individual cell resistance with reduced processor overhead.

At step 260, the method may loop back and repeat steps 220-250. This process may continue so long as the vehicle is 'on', as the method is constantly updating its estimates for one or more battery cell resistance values. In one embodiment, cell voltage and temperature readings $V_{cell}$ and $T_{cell}$ are measured at a slower rate (e.g., every 100 msec, 200 msec, etc.) than are the pack voltage and current readings $V_{pack}$ and $I_{pack}$ (e.g., every 10 msec, every 25 msec). This may result in $V_{pack}$ and $I_{pack}$ being measured a number of times for every reading of $V_{cell}$ and $T_{cell}$, and this can result in up-to-date values for $\Omega_{cellmin}$ and $\Omega_{cellmax}$ since their values will be updated, if necessary, every time $V_{pack}$ and $I_{pack}$ are newly measured. Skilled artisans will appreciate that especially at low temperatures, battery resistance versus temperature relationship may have a steep relationship (i.e., a small temperature variation can result in a large change in resistance.). Updating $\Omega_{cellmin}$ and $\Omega_{cellmax}$ often can be beneficial for accurately setting pack-level control points or thresholds (improved fuel efficiency) and for distinguishing real cell deviations from temperature-based ones (reduced battery replacement costs), to cite several possible advantages.

Step 270 uses the minimum and maximum cell resistances $\Omega_{cellmin}$ and $\Omega_{cellmax}$ in one or more operations associated with the vehicle battery. As already explained, the cell resistance estimates may be used for charging, discharging, cell balancing and/or other battery control processes where there is a flow of power or energy into or out of the vehicle battery. The cell resistance estimates may also be used for diagnosing the vehicle battery. Other potential uses or applications for the minimum and maximum cell resistances $\Omega_{cellmin}$ and $\Omega_{cellmax}$ are also possible. Step 270 may be performed on an interrupt-type basis (e.g., when the vehicle engages in a regenerative braking operation), a periodic basis or some other appropriate basis.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater or different steps than that shown here. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method for use with a vehicle battery pack having a plurality of battery cells, comprising the steps of:
   (a) measuring a plurality of battery cell temperatures ($T_{cell}$);
   (b) measuring a battery pack voltage ($V_{pack}$) and a battery pack current ($I_{pack}$);
   (c) using the battery pack voltage ($V_{pack}$) and the battery pack current ($I_{pack}$) to determine a battery pack resistance ($\Omega_{pack}$); and
   (d) using a first and a second estimate to determine one or more individual battery cell resistance(s) ($\Omega_{cell}$), the first estimate uses the battery pack resistance ($\Omega_{pack}$) to provide a baseline estimate for individual battery cell resistance, and the second estimate adjusts the baseline estimate for the individual battery cell resistance up or down based on one or more battery cell temperature(s) ($T_{cell}$)

in order to correlate battery cell resistance ($\Omega_{cell}$) with battery cell temperature ($T_{cell}$).

2. The method of claim 1, wherein step (a) further comprises measuring a plurality of battery cell temperatures ($T_{cell}$) and a plurality of battery cell voltages ($V_{cell}$); and step (d) further comprises using the plurality of battery cell temperatures ($T_{cell}$), the plurality of battery cell voltages ($V_{cell}$), and the battery pack resistance ($\Omega_{pack}$) to estimate one or more battery cell resistance(s) ($\Omega_{cell}$).

3. The method of claim 1, wherein step (a) further comprises measuring a plurality of battery cell temperatures ($T_{cell}$), where each battery cell temperature ($T_{cell}$) is representative of a cell block that includes a plurality of individual battery cells connected in parallel.

4. The method of claim 1, wherein step (a) further comprises measuring the plurality of battery cell temperatures ($T_{cell}$) at a first rate; and step (b) further comprises measuring the battery pack voltage ($V_{pack}$) and the battery pack current ($I_{pack}$) at a second rate, wherein the second rate is faster than the first rate.

5. The method of claim 1, wherein step (b) further comprises measuring the battery pack voltage ($V_{pack}$) and the battery pack current ($I_{pack}$) in a synchronous fashion.

6. The method of claim 1, wherein step (c) further comprises removing a hysteresis component and/or a polarization component before using the battery pack voltage ($V_{pack}$) and the battery pack current ($I_{pack}$) to determine the battery pack resistance ($\Omega_{cell}$).

7. The method of claim 1, wherein step (c) further comprises using a regression technique and previous readings for the battery pack voltage ($V_{pack}$) and the battery pack current ($I_{pack}$) to determine the battery pack resistance ($\Omega_{cell}$).

8. The method of claim 1, wherein the second estimate uses a look-up table and a temperature differential between a cell temperature and an average cell temperature across the vehicle battery to determine an offset value for adjusting the baseline estimate up or down.

9. The method of claim 8, wherein the offset value is negative for cell temperatures that are greater than the average cell temperature across the vehicle battery and is positive for cell temperatures that are less than the average cell temperature across the vehicle battery.

10. The method of claim 8, wherein the offset value is stored in a look-up table and is expressed as a percentage.

11. The method of claim 8, wherein the relationship between the offset value and the temperature differential is non-linear.

12. The method of claim 1, wherein step (d) further comprises using the plurality of battery cell temperatures ($T_{cell}$) and the battery pack resistance ($\Omega_{pack}$) to estimate a minimum battery cell resistance ($\Omega_{cell}$) and a maximum battery cell resistance ($\Omega_{cellmax}$) without estimating all of the battery cell resistances in between.

13. The method of claim 1, further comprising the step of:
(e) using the one or more battery cell resistance(s) ($\Omega_{cell}$) to diagnosis the battery pack and identify damaged battery cells.

14. The method of claim 1, further comprising the step of:
(e) using the one or more battery cell resistance(s) ($\Omega_{cell}$) to determine the control signals used for charging and/or discharging the battery pack.

15. A method for use with a vehicle battery pack having a plurality of battery cells, comprising the steps of:
(a) gathering cell-level readings, wherein the cell-level readings include information pertaining to a temperature spread across the vehicle battery pack;
(b) gathering pack-level readings;
(c) using the cell-level readings including the information pertaining to the temperature spread in conjunction with empirical data to refine a baseline estimate of one or more battery cell resistance(s) ($\Omega_{cell}$) that is based on the pack-level readings, wherein the baseline estimate is refined up or down in connection with the temperature spread and the refined estimate correlates cell resistance ($\Omega_{cell}$) with battery cell temperature ($T_{cell}$); and
(d) using the refined battery cell resistance(s) ($\Omega_{cell}$) when controlling a battery charging, discharging or cell balancing process.

* * * * *